United States Patent [19]

Honda

[11] Patent Number: 4,631,705
[45] Date of Patent: Dec. 23, 1986

[54] SEMICONDUCTOR INTEGRATED CIRCUIT MEMORY DEVICE
[75] Inventor: Masahiko Honda, Tokyo, Japan
[73] Assignee: NEC Corporation, Tokyo, Japan
[21] Appl. No.: 624,072
[22] Filed: Jun. 25, 1984
[30] Foreign Application Priority Data
  Jun. 23, 1983 [JP] Japan ............................... 58-113133
[51] Int. Cl.⁴ ........................ G11C 11/34; H01L 27/04
[52] U.S. Cl. .................................... 365/182; 365/154; 357/41
[58] Field of Search ............... 365/154, 156, 182, 202; 357/41, 23.9, 51, 59
[56] References Cited
  U.S. PATENT DOCUMENTS
  4,453,175 6/1984 Ariizumi et al. ................ 365/154 X Primary Examiner—Joseph A. Popek
Attorney, Agent, or Firm—Sughrue, Mion, Zinn, Macpeak & Seas

[57] ABSTRACT

A semiconductor integrated circuit memory device having a plurality of static type memory cells is disclosed, which has a high degree of circuit integration with improved layout structure of wiring layers. One of power supply supply lines, for instance Vcc line, extends in parallel to a word line, and by utilizing a double metallic layer technique, the other power supply line, i.e. ground line, is also extended in parallel to the word line. For example, the ground line is made of a first aluminium layer, and the two data lines intersecting at right angles with the ground line are made of a second aluminium layer provided by the intermediary of an insulating layer. With such a structure, reduction in size of a memory cell can be achieved without restriction by the wiring layers.

9 Claims, 12 Drawing Figures

FIG. 3
(PRIOR ART)
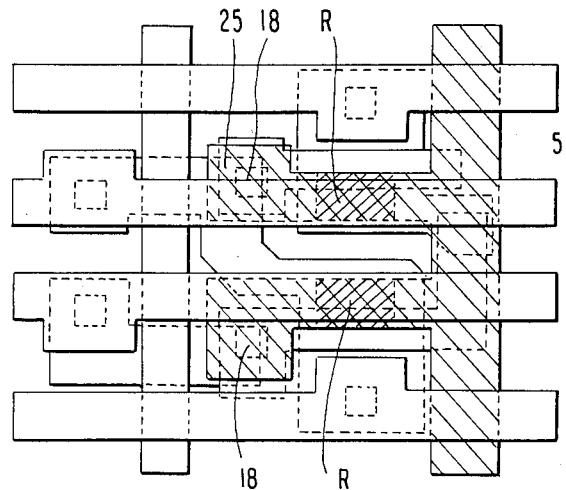
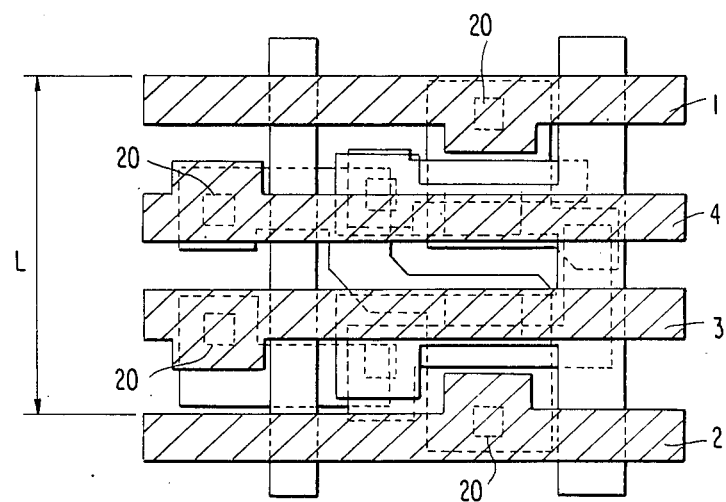
FIG. 4
(PRIOR ART)

SEMICONDUCTOR INTEGRATED CIRCUIT MEMORY DEVICE

BACKGROUND OF THE INVENTION

The present invention relates to a semiconductor integrated circuit memory device, and more particularly, to a semiconductor integrated circuit memory device including a plurality of static type memory cells.

Heretofore, static type memory devices making use of insulated gate field effect transistors (hereinafter abbreviated as IGFET's) were not necessitated to have the sizes of their respective memory cells reduced so small because of the fact that their memory capacities, that is, the number of their memory cells, were small such as 1 kilobits or 4 kilobits. However, as the memory capacity is increased such as 16 kilobits or 64 kilobits, it has naturally become necessary to reduce the cell size. Especially, it is necessary to reduce the size of the respective cells in the direction of extension of word lines (hereinafter called Y-direction). More particularly, in the case of employing a dual-in-line package, even if a memory capacity is increased, the width of the package, that is, the interval between the left and right pin columns has a fixed value such as, for example, 300 mils. Accordingly, it is impossible to increase the size in the same direction of the island sections on which memory elements (chips) are mounted as aligned in the same direction of the above-described package, and hence the size in the same direction of this memory element also cannot be made large even if the memory capacity is increased. On the other hand, taking into consideration the layout of a memory cell forming region and a peripheral circuit region including respective decoder circuits, sense amplifiers, address inverters, etc. within a memory element, the direction of extension of word lines, that is, the Y-direction is the widthwise direction of the above-mentioned package. Accordingly, with respect to the size of each memory cell, size reduction in the Y-direction is more important than size reduction in the direction at right angles to the Y-direction (hereinafter called X-direction). In addition, even if such restriction imposed by a package is not present, it is important to reduce the respective memory cells and thereby realize a high degree of circuit integration.

Here it is to be noted that the principal cause of the fact that the static type memory cell in the prior art could not be reduce to a desired occupation area exists in the layout structure of the respective wiring layers. In more particular, in the prior art with respect to each memory cell, one word line made of a first polycrystalline silicon layer and one of power supply lines, for example, a Vcc line made of a second polycrystalline silicon layer extend in the Y-direction. On the other hand, two data lines made of a first aluminum layer and the other of power supply lines, for example, a ground line made of, also, the first aluminum layer extend in the X-direction. In other words, three lines made of the single aluminum layer must intersect the edge line extending in the Y-direction of one memory cell. In view of a necessary width of each line and a necessary interval between lines, the size of one memory cell in the Y-direction must be large enough to allow the three wiring lines. Therefore, the principal cause of the memory cells in the prior art being unable to be reduced to a desired size was the existence of these three wiring lines with a single aluminium layer.

In addition, as a result of increase of a memory capacity, speed-up of an access speed also must be taken into considerations. In the static type memory element in the prior art, generally a polycrystalline silicon layer was used as a word line. This was due to the presence of the merit that by making use of a part of this layer as a gate electrode, source and drain regions of an IGFET can be formed in a self-alignment manner. However, since a polycrystalline silicon layer cannot have its resistance lowered to a desired extent, restriction is placed on speed-up of an access speed.

SUMMARY OF THE INVENTION

One object of the present invention is to provide a semiconductor integrated circuit memory device in which a high degree of circuit integration has been realized by improving a layout structure of respective wiring layers.

Another object of the present invention is to provide a semiconductor integrated circuit memory device of high degree of integration and high speed by improving word lines.

According to one feature of the present invention, there is provided a semiconductor integrated circuit memory device comprising a plurality of static type memory cells, each memory cell including first, second, third and fourth IGFET's formed in a semiconductor substrate and first and second load elements, a first data line extending in a first direction and connected to either one of source and drain regions of the third IGFET, a second data line extending in the first direction and connected to either one of source and drain regions of the fourth IGFET, a first power supply line extending in a second direction at right angles to the first direction and connected to the first and second load elements, a word line extending in the second direction and connected to gate electrodes of the third and fourth IGFET's, and a second power supply line extending in the second direction and connected to either one of source and drain regions of the first and second IGFET, respectively. Generally, the word line includes the gate electrodes of the third and fourth IGFET's. Namely, parts of the word line on the gate insulating films of third and fourth IGFET's are employed as the gate electrodes thereof. The word line and the gate electrodes of these IGFET's are made of a first polycrystalline silicon layer at a first level, the first power supply line is made of a second polycrystalline silicon layer at a second level, the second power supply line is made of a first metallic layer at a third level, and the first and second data lines are made of a second metallic layer at a fourth level. The first and second metallic layers are preferably of aluminum or aluminum alloy. The load elements may be resistor elements formed from the second polycrystalline silicon layer, or IGFET's formed in the semiconductor substrate. To realize high degree of integration and high speed by improving word lines, each word line may include a first word wiring layer made of the first polycrystalline silicon layer and forming the gate electrodes of the third and fourth IGFET's and a second word wiring layer made of the first metalic layer such as aluminum or aluminum alloy, every three or more of the memory cells being grouped into a memory cell block, and the first and second word layers are connected with each other at one location for every one of the memory cell blocks.

According to another feature of the present invention, there is provided a semiconductor integrated circuit memory device comprising a plurality of memory cells arranged in one direction in a semiconductor substrate, each memory cell including a IGFET, and a word line including a first word wiring layer of polycrystalline silicon extending in the one direction and forming each gate electrode of the IGFET and a second word wiring layer of metallic material extending substantially in parallel to the first word wiring layer, the first and second word wiring layer being connected with each other at one location for every three or more memory cells.

BRIEF DESCRIPTION OF THE DRAWINGS

FIGS. 3 and 4 are plan views showing the respective wiring layers in FIG. 2A.

DESCRIPTION OF THE PRIOR ART

Figure 1:
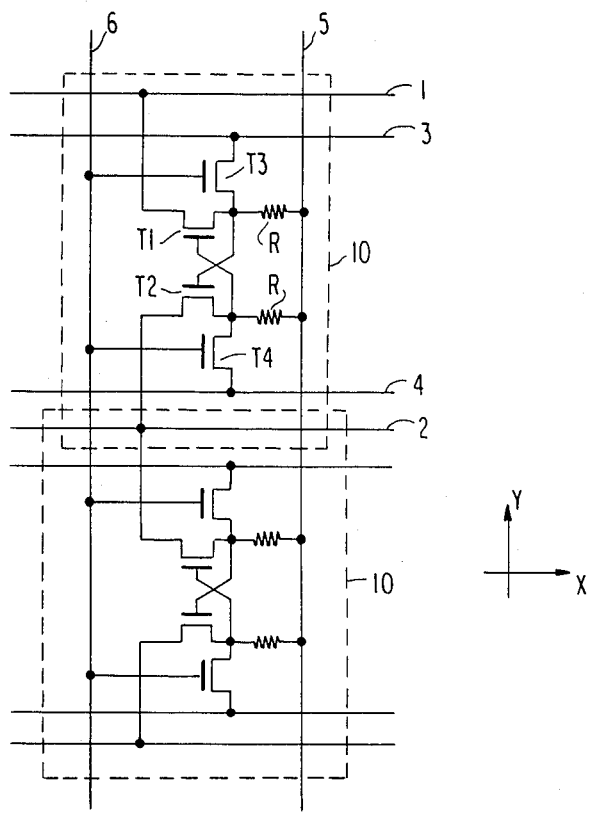
FIG. 1 is a circuit diagram showing the directions of the respective wirings in a static type memory device in the prior art.

FIG. 1 is a circuit diagram of a static type memory device in the prior art. In this figure, two memory cells 10 are illustrated. Reference characters $T_1$ and $T_2$ designate IGFET's forming a flip-flop circuit, reference character R designates load resistors, reference characters $T_3$ and $T_4$ designate transfer IGFET's, reference numerals 1 and 2 designate one of power supply lines, for instance, ground lines, numerals 3 and 4 designate data lines, numeral 5 designates the other power supply line, for instance, a Vcc line, and numeral 6 designates a word line. Here it is to be noted that since each of the ground lines 1 and 2 is common to two memory cells 10 adjacent to each other, an edge directed in the Y-direction of one memory cell 10 is traversed by three wirings 1, 3 and 4 and an edge directed in the X-direction of the same is traversed by two wirings 5 and 6.

Figure 2A:
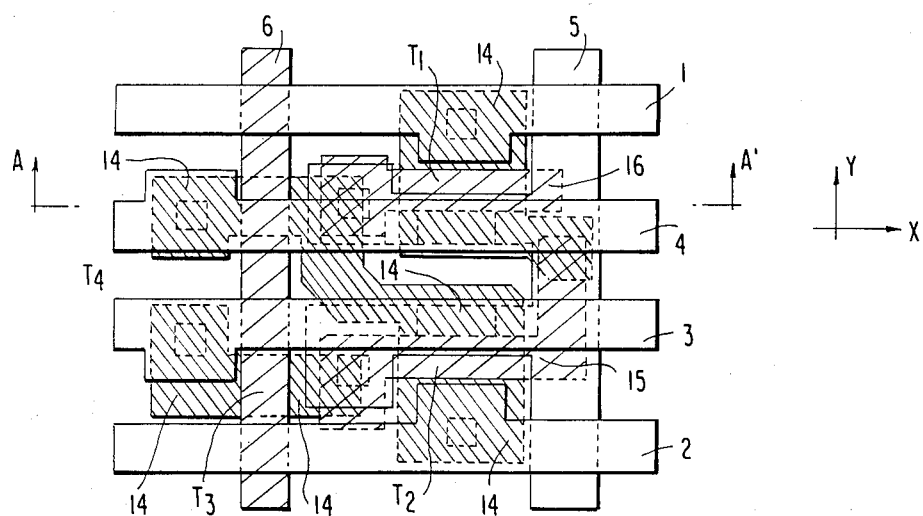
FIG. 2A is a plan view showing one static type memory cell in the prior art shown in FIG. 1 as formed in a semiconductor substrate.
Figure 2B:
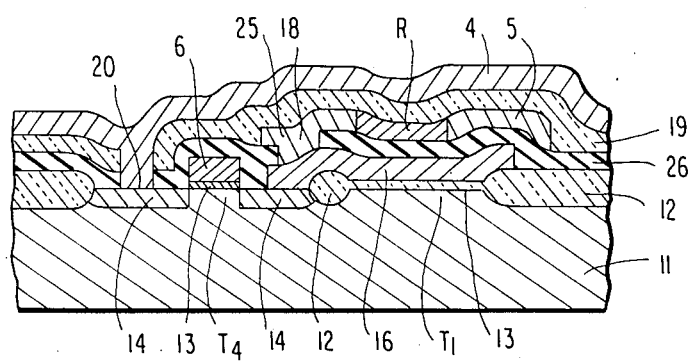
FIG. 2B is a cross-sectional view taken along line A—A' in FIG. 2A as viewed in the direction of arrows.

FIGS. 2A and 2B shows one memory cell in FIG. 1 as formed in a semiconductor substrate, and the respective wiring layers shown in FIG. 2A will be explained with reference to FIGS. 3 and 4. It is to be noted that in these figures component parts having the same functions as those shown in FIG. 1 are given like reference numerals.

In active regions adjacent to a thick field insulating film 12 provided on one major surface of a P-type semiconductor substrate 11 are formed IGFET's $T_1$ to $T_4$. More particularly, gate electrodes 16 and 15 of the IGFET's $T_1$ and $T_2$ made of a first polycrystalline silicon layer are formed on a thin gate insulating film 13. Also, by this first polycrystalline silicon layer is formed a word line 6 which also constitutes the gate electrodes of the IGFET's $T_3$ and $T_4$. N-type source and drain regions 14 of the IGFET's $T_1$ to $T_4$, respectively, are formed in a self-alignment manner by making use of the respective gate electrodes and the field insulating film as a mask. In FIG. 2A, the first polycrystalline silicon layer forming the word line and the respective gate electrodes is indicated by right-upwards hatching, and the N-type source and drain regions are indicated by left-upwards hatching.

Next, after an insulating film 26 has been formed of silicon dioxide or the like, a second polycrystalline silicon layer is produced and subjected to patterning, and thereby a power supply line 5(Vcc) is formed. This power supply line 5 is connected to resistors R. The resistors are connected to the first polycrystalline silicon layer forming the gate electrodes of the IGFET's $T_1$ and $T_2$ via connecting parts 25 made the second polycrystalline silicon layer and contact holes 18. The region indicated by left-upwards hatching in FIG. 3 is the second polycrystalline silicon layer, in which region cross-hatched portions are polycrystalline silicon resistors R formed by lowering an impurity concentration thereof.

Subsequently, after an insulating film 19 has been formed of a phospho-silicate glass (P.S.G.) film or a plasma silicon nitride film, an aluminium film of about 1 $\mu$m in thickness is formed thereon, and by patterning this aluminium film, data lines 4 and 3 and ground lines 1 and 2 are provided. These respective aluminium wiring layers are connected to the source and drain resiong 14 of the respective IGFET's through contact holes 20 formed in the insulating films 19, 26 and having a square plan shape of 2 $\mu$m $\times$ 2 $\mu$m. The respective wiring layers formed of this aluminium film are indicated by right-upwards hatching in FIG. 4.

Here it is to be noted that if a general standard that an aluminium wiring of 3 $\mu$m in width is broadened to 6 $\mu$m at a contact portion and an interval between an edge of the aluminium wiring layer at this contact portion and the adjacent aluminium wiring layer is chosen to be 2 $\mu$m, is followed, then a dimension L indicated in FIG. 4 would become 21 $\mu$m. If consideration is made on the basis of only the dimensions of the source and drain regions and channel regions of the respective IGFET's, the dimension in the Y-direction of one memory cell can be further reduced. Nevertheless, in the prior art, due to the presence of the aluminium wiring layer in the upper portion as described above, the dimension L is compelled to be chossen large.

DESCRIPTION OF PREFERRED EMBODIMENTS

First Preferred Embodiment

Figure 5A:
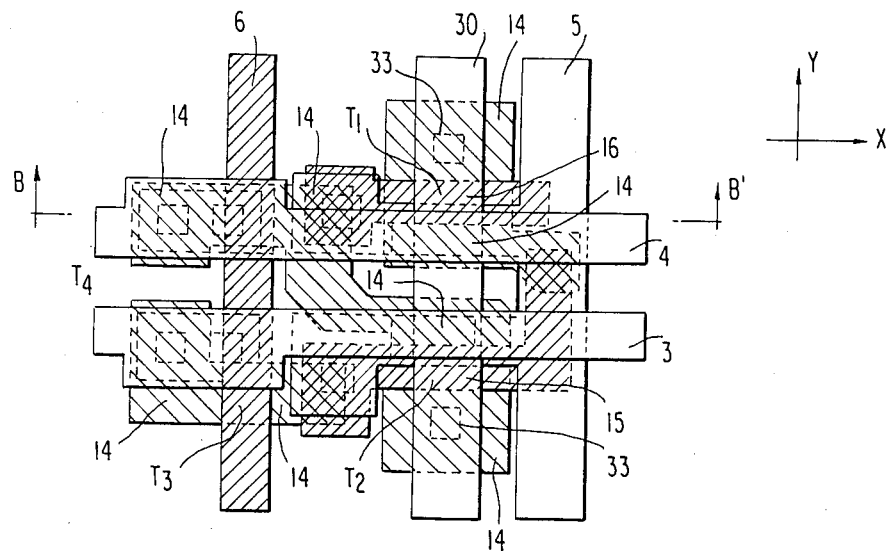
FIG. 5A is a plan view showing a first preferred embodiment of the present invention.
Figure 5B:
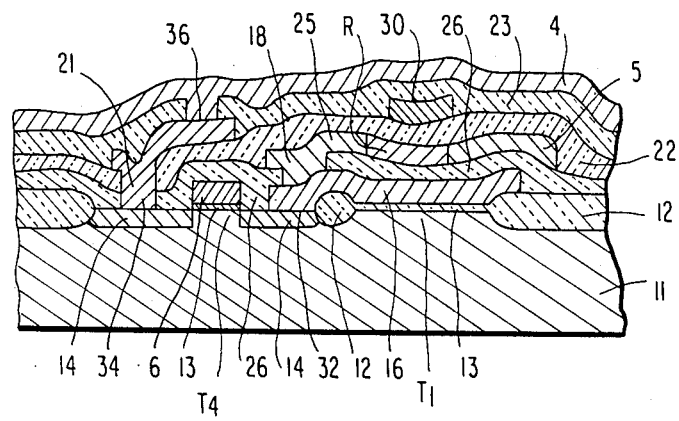
FIG. 5B is a cross-sectional view taken along line B—B' in FIG. 5A as viewed in the direction of arrows.

In the preferred embodiment of the present invention illustrated in FIGS. 5A and 5B, what is different from the structure in the prior art, resides in that the ground lines 1 and 2 extending in the X-direction in FIG. 2 are removed and in place therefor a ground line 30 made of a first aluminium layer is extended in the Y-direction and is connected to the source and drain regions 14 of the IGFET's $T_1$ and $T_2$ through contact holes 33 provided in an inter-layer insulating films 22, 26. And the data lines 3 and 4 are formed of a second aluminium layer provided via an insulating film 23. As will be apparent from FIG. 5A, if the above-described wiring layout is employed, the restriction in the Y-direction for the wiring layers would be eliminated, hence the area of each memory cell can be further reduced by making the source and drain regions and the like of the respective IGFET's as small as possible, and thereby a memory device having a high degree of circuit integration can be provided.

Figure 6:
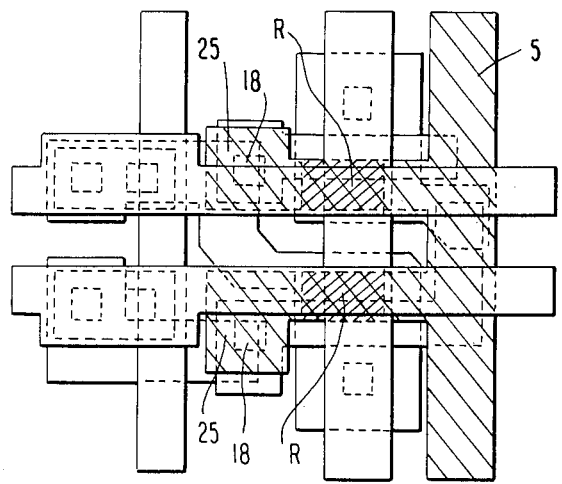
FIGS. 6 to 8 are plan views showing the respective wiring layers in FIG. 5A.
Figure 7:
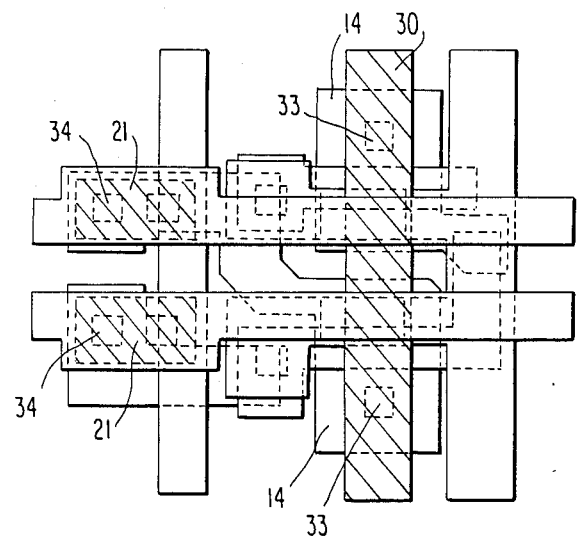
Figure 8:
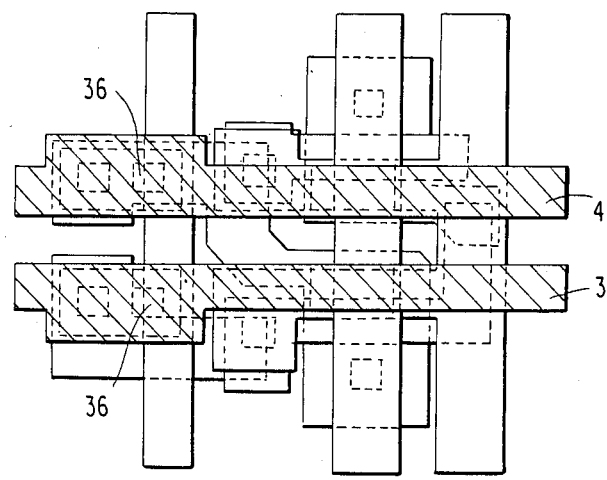

Now, the above-described structure of the memory cell will be explained in detail with reference to FIGS. 6 to 8. It is to be noted that in these figures, component parts having the same functions as those shown in FIGS. 1 to 4 are given like reference numerals. In more particular, on one major surface of a P-type semiconductor substrate 11 is selectively provided a thick field silicon oxide film 12 of about 1.0 μm in thickness as partly buried in the substrate. IGFET's $T_1$ to $T_4$ are formed in the active regions adjacent to, that is, in practice surrounded substantially by this field insulating film 12. These IGFET's have gate insulating films 13 of 400 to 500 Å thickness, and a first polycrystalline silicon layer is provided on the gate insulating films 13 and the field insulating film 12, and by patterning this first polycrystalline silicon layer, a word line 6 including gate electrodes of the IGFET's $T_3$ and $T_4$ and gate electrodes 16 and 15 of the IGFET's $T_1$ and $T_2$ are formed. Subsequently, an N-type impurity is doped from the above of the first polycrystalline silicon layer, then the N-type impurity is introduced into the polycrystalline silicon layer, resulting in lowering of the resistance, and at the same time, N-type source and drain regions of the respective IGFET's can be formed in a self-alignment manner with respect to the gate electrodes. In addition, at the locations 32 (FIG. 5B) where this first polycrystalline silicon layer makes contact with the semiconductor substrate, the N-type impurity is introduced through the polycrystalline silicon layer, and thereby direct contacts for the source and drain regions are formed. In FIG. 5A, right-upwards hatching indicates the first polycrystalline silicon layer, and left-upwards hatching indicates the source and drain regions. Accordingly, in FIG. 5A, the locations where the left-upwards hatching and the right-upwards hatching overlap, are the direct contact portions, and at these locations the first polycrystalline silicon wiring connected to the respective gate electrodes, are connected to the source and drain regions 14 of the respective IGFET's. Next, an insulating film 26 of about 4000 Å in thickness is formed by introducing, for example, a thermal oxidation process, and a second polycrystalline silicon layer having a low impurity concentration is formed on the insulating film 26. Then the second polycrystalline layer is subjected to patterning, and by introducing an N-type impurity while masking the portions to be used as resistor regions R, a power supply line 5 and connecting parts 25 are formed. More particularly, the regions indicated by left-upwards hatching in FIG. 6 are the power supply line 5 and connecting parts 25, and the cross-hatched regions are resistor regions R. Namely, power supply line 5 is connected to the polycrystalline silicon resistors R having low impurity concentration. The resistors R are connected to the gate electrodes 16 and 15 of the IGFET's $T_1$ and $T_2$, respectively, through the connecting parts having high impurity concentration as that of the power supply line 5 and through contact holes 18 formed in the insulating film 26. Subsequently, an insulating film 22 of about 5000 Å in thickness is formed of a P.S.G. or plasma silicon nitride film, then a first aluminium layer of 5000 Å in thickness is produced and subjected to patterning, and thereby a power supply line, that is, a ground line 30 directed in the Y-direction is extended. This power supply line 30 is connected to the source and drain regions 14 of the IGFET's $T_1$ and $T_2$ through contact portions 33 formed in the insulating films 22, 26. Likewise, electrode lead-out wiring layers 21 connected to the source and drain regions 14 of the IGFET's $T_3$ and $T_4$ through contact holes 34 are also made of this first aluminium layer. These ground line 30 and electrode lead-out wiring layers 21 are indicated by left-upwards hatching in FIG. 7. Next, an insulating film 23 of about 5000 Å in thickness is formed of a P.S.G. or plasma silicon nitride film, then a second aluminium film of 1.0 μm thickness is deposited and subjected to patterning, and thereby data lines 3 and 4 extending in the X-direction are formed. These data lines are connected to the respective electrode lead-out wirings 21 at contact portions 36. These data lines are indicated by left-upwards hatching in FIG. 8.

The respective data lines, power supply line and ground line are illustrated with respect to a single memory cell. However, since a plurality of memory cells are arrayed in a matrix form in a memory device, as a matter of course, the respective lines illustrated in FIGS. 5 to 8 are in themselves extended in the X-direction or in the Y-direction to be connected to the other memory cells. The polycrystalline silicon resistors as load elements could be replaced by IGFET's formed in the semiconductor substrate. While the ground line 30 and the power supply line 5 extending in the Y-direction are depicted not to overlap with each other in the above-described figures for the purpose of avoiding complexity of the figures, in the practical manufacture of the memory device the ground line 30 and the power supply line 5 could be overlapped, in the plan view, with each other because they are insulated from each other by the insulating film 22. Accordingly, although the ground line extending in the Y-direction is provided, the width in the X-direction of a memory cell need not be broadened. And with respect to the width in the Y-direction of a memory cell, since the ground line that was present in the prior art structure was eliminated, the area necessitated for wiring can be reduced by the corresponding amount, and thereby a degree of circuit integration can be improved. In other words, the layout structure is not restricted by a plan configuration of wiring layers, but it is only necessary to consider the layout of only the respective regions of the IGFET's within a semiconductor substrate.

Second Preferred Embodiment

A degree of circuit integration can be enhanced by employing the wiring layout structure as disclosed in the first preferred embodiment. In the second preferred embodiment illustrated in FIGS. 9 and 10, furthermore propagation delay is improved. In order to quicken the propagation operation of a word line, it is only necessary to use a material having a low specific resistance such as aluminium. However, if aluminium is used for the gate electrodes, then the source and drain regions cannot be formed in a self-alignment manner, and so, the capacitances between these regions and the gate electrode would become large.

On the other hand, a modified method may be conceived, in which the respective IGFET's $T_3$ and $T_4$ within a memory cell are formed by making use of independent polycrystalline silicon gate electrodes, or gate electrodes of the IGFET's $T_3$ and $T_4$ within each memory cell are formed of a continuous polycrystalline silicon layer, and thereafter the polycrystalline silicon gate electrodes are connected through apertures in an insulating film thereabove to a word line made of aluminium. However, in such a modified case, the number of the contacts between the word line made of aluminium and the gate electrodes made of polycrystalline silicon would become very large. In this case, the influence of the area of the contacts upon a degree of circuit integration must be taken into consideration.

Figure 9:
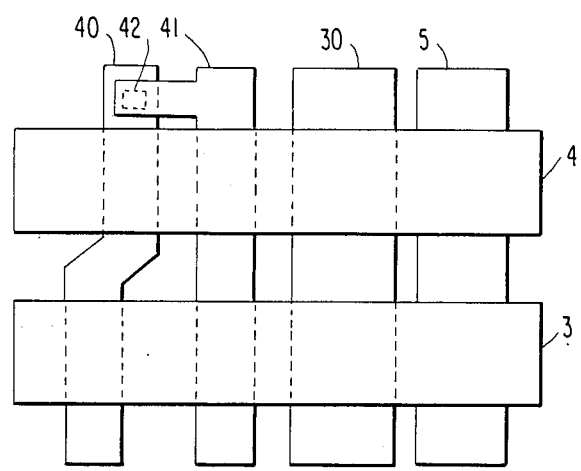
FIG. 9 is a plan view showing a second preferred embodiment of the present invention.
Figure 10:
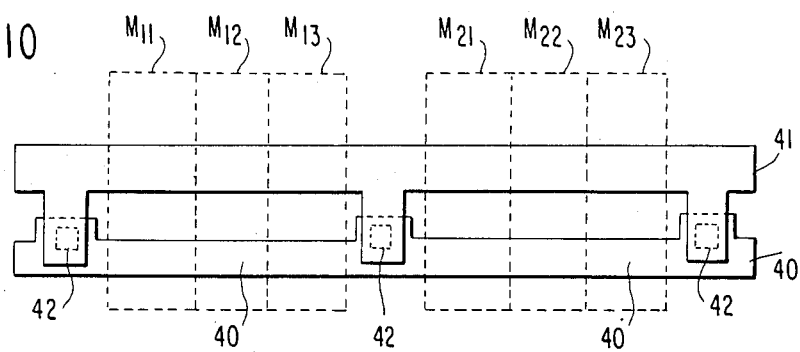
FIG. 10 is a plan view showing the case where the technique illustrated in FIG. 9 is applied to a plurality of memory cells.

Therefore, in the second preferred embodiment of the present invention, a first word wiring layer 40 is made of polycrystalline silicon, a second word wiring layer 41 is made of aluminium, and the first word layer 40 and the second word layer 41 are connected with each other at contact portions 42 which are provided one for every three or more memory cells. If such provision is made, since the gate electrodes are made of a part of the first word wiring layer 40 made of polycrystalline silicon, the source and drain regions can be formed in a self-alignment manner, and the propagation speed can be improved owing to the second word wiring layer 41 made of aluminium. Moreover, since the first and second word wiring layers 40 and 41 made contact with each other for every three or more memory cells instead of making contact for every memory cell, the number of the contacts can be reduced. How many memory cells are to be grouped into a block to make contact for every contact, could be determined taking into consideration the increase of the area of the contact portions and the delay along the word line, that is, the delay along the first word layer between adjacent two contacts. However, in a static type memory device, a delay of a signal caused by the polycrystalline silicon word layer between adjacent ones of the every three memory cells is substantially out of the question. In FIGS. 9 and 10, component parts having the same function as those included in the first preferred embodiment shown in FIGS. 5 to 8 are given like reference numerals, and therefore, further explanation thereof will be omitted.

The first word wiring layer 40 made of a polycrystalline silicon layer and also serving as the gate electrodes of the IGFET's T$_3$ and T$_4$ is formed in a similar manner to the word line 6 in the first preferred embodiment. Subsequently, when the ground line 30 is formed by a first aluminium layer, the second word wiring layer 41 is formed as spaced from the ground line 30. The first and second word wiring layers are connected each other through apertures 42 opened in an insulating film, for instance, the insulating films 22 and 26 in the first preferred embodiment. While the first word wiring layer 40 and the second word wiring layer 41 are depicted so as not to overlap, in the plan view, with each other for the purpose of avoiding complexity of the drawings, in practice the both word lines can be disposed in an overlapped relationship because they are insulated from each other by the insulating film interposed therebetween. In any way, even through the second word wiring layer is provided, the occupation area of a memory cell would not be increased. With regard to the connection between the first and second word wiring layers 40 and 41, as shown in FIG. 10 in which every memory cell is identified generally by a symbol Mij, three contiguous memory cells, for instance, M$_{11}$, M$_{12}$ and M$_{13}$ are grouped into one block, the next three contiguous memory cells M$_{21}$, M$_{22}$ and M$_{23}$ are grouped into another block, and so on, and for every one of these blocks the first word layer 40 and the second word layer 41 are connected with each other. It is to be noted that the word line structure shown in this embodiment can be employed in a dynamic type RAM as well as the static type RAM. Namely, in the dynamic type RAM device, a plurality of memory the cells are provided in a matrix form, and each memory cell comprises one transfer gate and one capacitor. The first word wiring layer 40 of polycrystalline silicon extends in one direction and serves as the transfer gates on the active regions of dynamic memory cell, and the second word wiring layer 41 of aluminum extends in the one direction and is connected to the first word wiring layer at contact portions which are provided one for every three or more dynamic memory cells.

What is claimed is:

1. A semiconductor integrated circuit memory device comprising a pluraltiy of static type memory cells, each memory cell including first, second, third and fourth insulated gate field effect transistors formed in a semiconductor substrate and first and second load elements, one of source and drain regions of said first transistor being coupled to one of source and drain regions of said third transistor, to the gate electrode of said second transistor and to one end of said first load element, one of source and drain regions of said second transistor being coupled to one of source and drain regions of said fourth transistor, to the gate electrode of said first transistor and to one end of said second load element, a first data line extending in a first direction and connected to the other of source and drain regions of said third transistor, a second data line extending in said first direction and connected to the other of source and drain regions of said fourth transistor, a first power supply line extending in a second direction perpendicular to said first direction and connected to the other ends of said first and second load elements, respectively, a word line extending in said second direction and coupled to gate electrodes of said third and fourth transistors, and a second power supply line extending in said second direction and connected to the other of source and drain regions of said first transistor and to the other of source and drain regions of said second transistor, respectively, said second power supply line being formed of a first metallic layer, and said first and second data lines being formed of a second metallic layer and crossing said second power supply line with an insulating layer interposed therebetween.

2. A semiconductor integrated circuit memory device as claimed in claim 1, in which said word line and gate electrodes of said first, second, third and fourth transistors are formed of a first polycrystalline silicon layer at a first level, said first power supply line being formed of a second polycrystalline silicon layer at a second level, said second power supply line being positioned at a third level, and said first and second data lines being positioned at a fourth level.

3. A semiconductor integrated circuit memory device as claimed in claim 2, in which said load elements are formed of said second polycrystalline silicon layer.

4. A semiconductor integrated circuit memory device as claimed in claim 2, in which said word line includes a first word wiring layer made of said first polycrystalline silicon layer, extending in said second direction and forming said gate electrodes of said third and fourth transistors, and a second word wiring layer made of a metallic layer of the same level as that of said first metallic layer, every three or more of said memory cells being grouped into a memory cell block, and said first and second word wiring layers are connected with each other at one location for every one of said memory cell blocks.

5. A semiconductor integrated circuit memory device as claimed in claim 1, in which said word line includes a first word wiring layer made of polycrystalline silicon, extending in said second direction and forming said gate electrodes of said third and fourth transistors, and a second word wiring layer made of a metallic layer at the same level as that of said first metallic layer and extending substantially in parallel to said first word wiring layer, every three or more of said memory cells being grouped into a memory cell block, and said first and second word wiring layers being connected with each other at one location for every one of said memory cell blocks.

6. A semiconductor integrated circuit memory device as claimed in claim 1, in which said first and second metallic layers are made of aluminium or aluminium alloy.

7. A semiconductor integrated circuit memory device comprising a plurality of memory cells arranged in one direction in a semiconductor substrate, each memory cell including a plurality of insulated gate type field effect transistors, and a word line including a first word wiring layer made of polycrystalline silicon extending in said one direction and forming each gate electrode of two of said transistors and a second word wiring layer made of metallic material extending substantially in parallel to said first word wiring layer, said first and second word wiring layers being connected with each other at one location for every three or more memory cells.

8. A semiconductor integrated circuit memory device comprising a plurality of static type memory cells, each memory cell including first, second, third and fourth insulated gate field effect transistors formed in a semiconductor substrate and first and second load elements, one of source and drain regions of said first transistor being coupled to one of source and drain regions of said third transistor, to the gate electrode of said second transistor and to one end of said first load elements, one of source and drain regions of said second transistor being coupled to one of source and drain regions of said fourth transistor, to the gate electrode of said first transistor and to one end of said second load element, a first power supply line extending in a first direction and connected to other ends of said first and second load elements, respectively, a word line extending in said first direction and coupled to gate electrodes of said third and fourth transistors, respectively, a second power supply line extending in said first direction and connected to the other of source and drain regions of said first and second transistors, respectively, through openings formed in a first insulating layer, said second power supply line being made of a first metallic layer of a first level, first and a second intermediate electrode layers made of said first metallic layer of said first level connected to the others of source and drain regions of said third and fourth transistors, respectively, through openings formed in said first insulating layer, respectively, a second insulating layer covering said power supply line and said intermediate electrode layers and having first and second apparatus exposing respective portions of said first and second intermediate electrode layers, a first data line connected to said first intermediate electrode layer through said first aperture and extending on the surface of said second insulating layer in a second direction perpendicular to said first direction, said first data line being made of a second metallic layer of a second level above said first level, and a second data line extending on said second insulating layer in said second direction, made of said second metallic layer and electrically connected to said second intermediate electrode layer via said second aperture.

9. A semiconductor integrated circuit memory device as claimed in claim 8, in which said first and second metallic layers are made of aluminum or aluminum alloy.

* * * * *

UNITED STATES PATENT AND TRADEMARK OFFICE
CERTIFICATE OF CORRECTION

PATENT NO. : 4,631,705

DATED : December 23, 1986

INVENTOR(S) : Masahiko HONDA

It is certified that error appears in the above-identified patent and that said Letters Patent is hereby corrected as shown below:

Column 8, line 59   Delete "2" and insert --1--.

Signed and Sealed this

Twenty-fifth Day of August, 1987

*Attest:*

DONALD J. QUIGG

*Attesting Officer*   *Commissioner of Patents and Trademarks*